United States Patent
Seningen

(10) Patent No.: US 10,177,051 B2
(45) Date of Patent: Jan. 8, 2019

(54) TRANSISTOR WORK FUNCTION ADJUSTMENT BY LASER STIMULATION

(71) Applicant: Apple Inc., Cupertino, CA (US)

(72) Inventor: Michael R. Seningen, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/017,801

(22) Filed: Jun. 25, 2018

(65) Prior Publication Data

US 2018/0308772 A1    Oct. 25, 2018

Related U.S. Application Data

(63) Continuation of application No. 14/981,159, filed on Dec. 28, 2015, now Pat. No. 10,008,423.

(51) Int. Cl.

| | |
|---|---|
| *H01L 21/66* | (2006.01) |
| *B23K 26/351* | (2014.01) |
| *B23K 26/00* | (2014.01) |
| *G01R 31/28* | (2006.01) |
| *G01R 31/26* | (2014.01) |
| *H01L 29/66* | (2006.01) |
| *H01L 21/67* | (2006.01) |
| *H01L 21/321* | (2006.01) |
| *H01L 21/268* | (2006.01) |
| *B23K 26/354* | (2014.01) |
| *B23K 101/42* | (2006.01) |

(52) U.S. Cl.
CPC .......... *H01L 22/20* (2013.01); *B23K 26/0081* (2013.01); *B23K 26/351* (2015.10); *B23K 26/354* (2015.10); *G01R 31/2621* (2013.01); *G01R 31/2851* (2013.01); *H01L 21/268* (2013.01); *H01L 21/321* (2013.01); *H01L 21/67115* (2013.01); *H01L 21/67288* (2013.01); *H01L 29/66477* (2013.01); *B23K 2101/42* (2018.08); *B23K 2201/42* (2013.01)

(58) Field of Classification Search
CPC ... H01L 22/20; B23K 26/351; B23K 26/0081; G01R 31/2621; G01R 31/2851
USPC ........................................................ 702/108
See application file for complete search history.

(56) References Cited

U.S. PATENT DOCUMENTS

| | | | |
|---|---|---|---|
| 8,563,410 B2 | 10/2013 | Lin et al. | |
| 8,921,733 B2 | 12/2014 | Gaudiosi et al. | |
| 8,932,923 B2 | 1/2015 | Kim et al. | |
| 8,987,096 B2 | 3/2015 | Chen et al. | |
| 9,105,577 B2 | 8/2015 | Cheng et al. | |
| 2014/0210511 A1* | 7/2014 | Bartling | H03K 19/173 326/38 |
| 2014/0211576 A1* | 7/2014 | Bartling | G11C 29/36 365/189.16 |

(Continued)

*Primary Examiner* — Harry W Byrne
(74) *Attorney, Agent, or Firm* — Meyertons, Hood, Kivlin, Kowert & Goetzel, P.C.

(57) ABSTRACT

Methods and apparatuses for modifying a work function of transistors included in an integrated circuit are disclosed. A tester unit may be configured to test an integrated circuit that includes a plurality of circuit paths. The tester unit may be further configured to analyze the results from testing the integrated circuit and, based on the analysis, identify a circuit path that fails to meet a desired performance goal. A work function of a transistor included in the identified circuit path may be modified by the tester unit using an energy source external to the integrated circuit.

20 Claims, 10 Drawing Sheets

(56) References Cited

U.S. PATENT DOCUMENTS

2015/0263069 A1* 9/2015 Jo .................... H01L 45/085
                                                   365/148

* cited by examiner

TRANSISTOR WORK FUNCTION
ADJUSTMENT BY LASER STIMULATION

PRIORITY INFORMATION

The present application is a continuation of U.S. application Ser. No. 14/981,159, filed Dec. 28, 2015 (Now U.S. patent Ser. No. 10/008,423), the disclosure of which is incorporated by reference herein in its entirety.

BACKGROUND

Technical Field

Embodiments described herein relate to integrated circuits, and more particularly, to techniques for adjusting circuit performance post manufacture.

Description of the Related Art

Integrated circuits typically include different functional units, such as, e.g., processor cores, each of which may include multiple circuits. Such circuits may perform logic or arithmetic operations, or analog functions, such as, amplification, for example. As part of the design process, circuits may be simulated using models of transistors, metal wiring, and other components included in a particular circuit. Such simulations may assist in determining if a particular circuit design may achieve desired performance goals.

During the semiconductor manufacturing process, variations in lithography, transistor dopant levels, etc., may result in differences between actual electrical characteristics of circuit components and the electrical characteristics predicted by the models.

Typically, such differences in characteristics are determined during one or more test operations performed on an integrated circuit after completion of the semiconductor manufacturing process. In some cases, the actual electrical characteristics may render one or more circuits of the integrated circuit inoperable. Other circuits may operate, but only under a subset of the desired range of operating conditions.

SUMMARY OF THE EMBODIMENTS

Various embodiments of a system are disclosed. Broadly speaking, a system and a method are contemplated in which a work function of a transistor included in an integrated circuit may be modified. An integrated circuit including a plurality of circuit paths may be tested by a tester unit. The tester unit may be configured to analyze results of testing the integrated circuit and identify at least one circuit path of the plurality of circuits paths that fails to meet a first desired performance goal dependent upon the analysis of the results. The tester unit may be further configured to modify a first work function of a first transistor included in the at least one circuit path using an energy source external to the integrated circuit.

In one embodiment, the integrated circuit includes at least one memory, which includes a plurality of memory cells. The tester unit may be further configured to identify at least one memory cell of the plurality of memory cells that fails to meet a second desired performance goal.

In a further embodiment, the tester unit may be further configured to modify a second work function of a second transistor included in the at least one memory cell using the energy source external to the integrated circuit.

BRIEF DESCRIPTION OF THE DRAWINGS

The following detailed description makes reference to the accompanying drawings, which are now briefly described.

Figure 1:
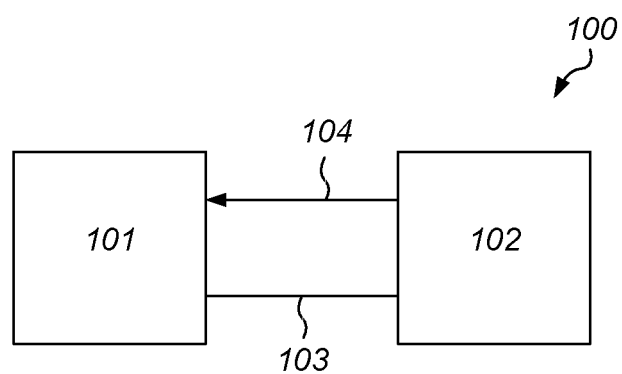
FIG. 1 illustrates an embodiment of a system for testing an integrated circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

During the manufacture of an integrated circuit, differences in lithography, implant levels, etc., may result in differences in deviations from the predicted operation of a particular circuit included in the integrated circuit. For example, a circuit may not operate at power supply voltage levels or operating frequency predicted by simulation. Circuits that do not performed as predicted by simulation are typically identified during one or more test operations performed once the integrated circuit has been fabricated.

Tester units external to an integrated circuit may be employed to perform such tests. The test may include having the integrated circuit operate on a set of known data and then comparing the results of the operations to simulated results. In some cases, the tests may be performed at different power supply voltage levels, temperatures, and the like. Integrated circuits that fail the tests or that do not achieve desired performance levels may be discarded as unusable, and contribute to lower manufacturing yields and higher production costs. The embodiments illustrated in the drawings and described below may provide techniques for modifying transistors in some circuits after the manufacturing process has completed, thereby allowing for the repair of some of the unusable integrated circuits.

An embodiment of a system for testing an integrated circuit is illustrated in FIG. 1. In the illustrated embodiment, system 100 includes integrated circuit 101 and tester unit 102. Tester unit 102 is coupled to integrated circuit 101 via bus 103. In some embodiments, bus 103 may be coupled to a dedicated test port of integrated circuit 101 (not shown).

During operation, tester unit 102 may provide stimulus, in the form of test data and instructions, to integrated circuit 101 via bus 103. Integrated circuit 101 may then execute the test instructions using the test data, and return results from executing the test instructions to tester unit 102 via bus 103. In various embodiments, multiple sets of test data and instructions may be used by tester unit 102 to exercise different functional units, such as, e.g., a memory, included in integrated circuit 101.

Tester unit 102 may compare results received from integrated circuit 101 to expected results. In some embodiments, the expected results may be previously generated using a behavioral model of the integrated circuit, or any other suitable method. Based on the comparison of the received results and the expected data, tester unit 102 may be able to identify failing or marginal circuits within integrated circuit 101. In some embodiments, tester unit 102 may send additional test data and instructions to integrated circuit 101 to further refine the identification of the failing or marginal circuits, in some cases, specific transistors may be identified.

Using information regarding the physical design of integrated circuit 101, tester unit 102 may adjust a work function or one of more transistors included in identified failing or marginal circuits to repair or improve performance of the aforementioned circuits. As described below in more detail, tester unit 102 may apply energy 104 to integrated circuit 101 to modify the work functions of selected transistors. In various embodiments, energy 104 may be emitted from a laser or any other suitable device included in tester 102. Energy 104 may be electromagnetic radiation of varying frequencies. In some embodiments, a particular frequency of energy 104 may modify a work function of a particular transistor in a particular way, while a different frequency may modify the work function in a different way.

It is noted that the system illustrated in FIG. 1 is merely an example. In other embodiments, tester 102 may be configured to test multiple integrated circuits in parallel.

Figure 2:
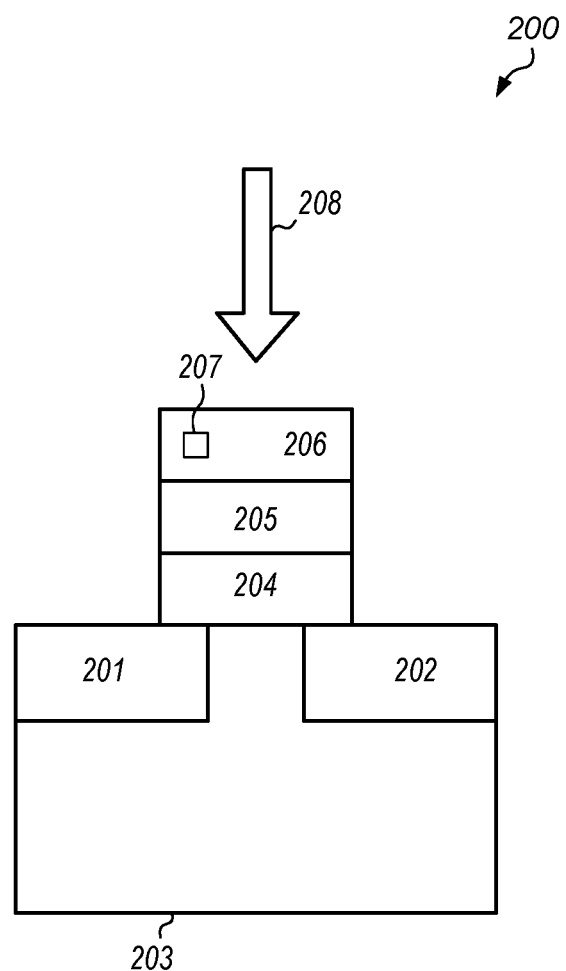
FIG. 2 illustrates a cross section of a field effect transistor.

Turning to FIG. 2, a cross section of a particular embodiment of a field-effect transistor (FET) is illustrated. FET 200 may, in various embodiments, correspond to a metal-oxide semiconductor field-effect transistor (MOSFET). In the illustrated embodiments, FET 200 source region 201 and drain region 202 are implanted into substrate 203. In various embodiments, substrate 203 may be silicon or any other suitable semiconductor material.

Straddling the separation between source region 201 and drain region 202 is oxide region 204. A high dielectric constant material (or simply a "high-k" material), such as, e.g., hafnium, may be used to fabricate oxide region 204. Situated above oxide region 204 is metal gate region 205. Materials such as tantalum, tantalum nitride, or other suitable metal, may be used to form metal gate region 205. Placed atop the metal gate region 205 is low resistance layer 206, which may be fabricated from a metal or other suitable low resistance material.

During operation, a voltage is applied to low resistance layer 206 and metal gate 205. The applied voltage generates an electric field across oxide region 204. If the applied voltage is greater than a threshold voltage of the FET 200, a conduction region will form between source region 201 and drain region 202 allowing current to flow.

The threshold voltage of FET 200 may be dependent upon the difference in work functions between gate region 205 and the material between source region 201 and drain region 202. As used and described herein, a work function of a material is a minimum amount of thermodynamic work needed to remove an electron from the material. By modifying the work function of gate region 205, the threshold voltage of FET 200 may be adjusted, thereby changing the performance of a circuit in which FET 200 is included. For example, by reducing threshold voltages of transistors included in a logic gate logic (e.g., an inverter), the logic gate may be made more sensitive to changes in input voltages, thereby reducing the delay of the logic gate in responding to changes in the input voltages.

During manufacture, the threshold voltage of FET 200 may be set by implants, choice of materials, etc. Typically, once FET 200 has been fabricated, adjustment of the threshold voltage is no longer possible. If, however, energy 208 is applied by an external source, such as, e.g., tester unit 102 as illustrated in the embodiment of FIG. 1, atom 207 may be moved from low resistance region 206 into gate region 205. The addition of atom 207 into gate region 205 may affect the work function of gate region 205, thereby adjusting the threshold voltage of FET 200. Although a single atom is shown in the embodiment depicted in FIG. 2, in other embodiments, any suitable number of atoms may be employed. It is noted that although atom 207 is depicted as being included in low resistance region 206, in other embodiments, additional layers (not shown) may be included in FET 200 in order to provide multiple atoms of varying types for use in work function modification.

In some embodiments, atoms of different types of atoms, such as, e.g., oxygen, may be available in low resistance region 206. The inclusion of different types of atoms may affect the work function of gate region 205 to differing degrees. For example, a small change in the work function of FET 200 may be made my moving an atom of one type from low resistance region 206 into gate region 205 while a larger change in the work function of FET 200 may be achieved by moving an atom of a different type into gate region 205.

In some embodiments, different types of atoms may be moved into gate region 205 using different types of energy 208 applied from a source external to the integrated circuit. For example, energy 208 may include laser light, or other electromagnetic radiation, at a particular wavelength (or frequency) for moving atoms of a particular type into gate region 205, and may include laser light at a different wavelength (or frequency) for moving atoms of a different type into gate region 205. In other embodiments, additional circuitry included in the integrated circuit may be used to generate localized magnetic or electric fields that may be used to move atoms into or out of gate region 205.

It is noted that the embodiment depicted in FIG. 2 is merely an example. Although a planar transistor is depicted, in other embodiments, the work function of non-planar transistors, such as, e.g., fin field-effect transistors (FinFETs) may be modified in a similar fashion.

Figure 3:
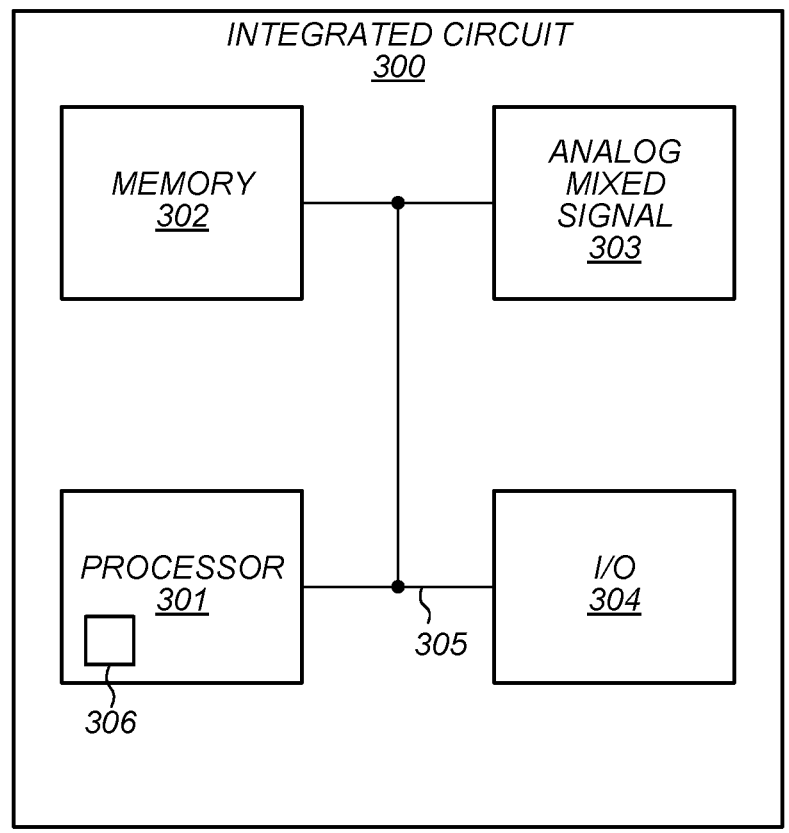
FIG. 3 illustrates an embodiment of an integrated circuit.

A block diagram of an integrated circuit is illustrated in FIG. 3. Integrated circuit 300 may, in various embodiments, correspond to integrated circuit 101 as illustrated in system 100. In the illustrated embodiment, the integrated circuit 300 includes a processor 301 coupled to memory block 302, and analog/mixed-signal block 303, and I/O block 304 through internal bus 305. In various embodiments, integrated circuit 300 may be configured for use in a desktop computer, server, or in a mobile computing application such as, e.g., a tablet or laptop computer.

As described below in more detail, processor 301 may, in various embodiments, be representative of a general-purpose processor that performs computational operations. For example, processor 301 may be a central processing unit (CPU) such as a microprocessor, a microcontroller, an application-specific integrated circuit (ASIC), or a field-programmable gate array (FPGA). In some embodiments, processor 301 may include one or more circuit paths 306 which may be configured to perform various logic or arithmetic operations.

Memory block 302 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 3, a single memory block is depicted. In other embodiments, any suitable number of memory blocks may be employed.

Analog/mixed-signal block 303 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 303 may be configured to perform power management tasks with the inclusion of on-chip power supplies and voltage regulators. Analog/mixed-signal block 303 may also include, in some embodiments, radio frequency (RF) circuits that may be configured for operation with wireless networks.

I/O block 304 may be configured to coordinate data transfer between integrated circuit 300 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 304 may be configured to implement a version of Universal Serial Bus (USB) protocol or IEEE 1394 (Firewire®) protocol.

I/O block 304 may also be configured to coordinate data transfer between integrated circuit 300 and one or more devices (e.g., other computer systems or integrated circuits) coupled to integrated circuit 300 via a network. In one embodiment, I/O block 304 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 304 may be configured to implement multiple discrete network interface ports.

It is noted that the embodiment illustrated in FIG. 3 is merely an example. In other embodiments, different functional units and different configurations of functional units are possible and contemplated.

Figure 4:
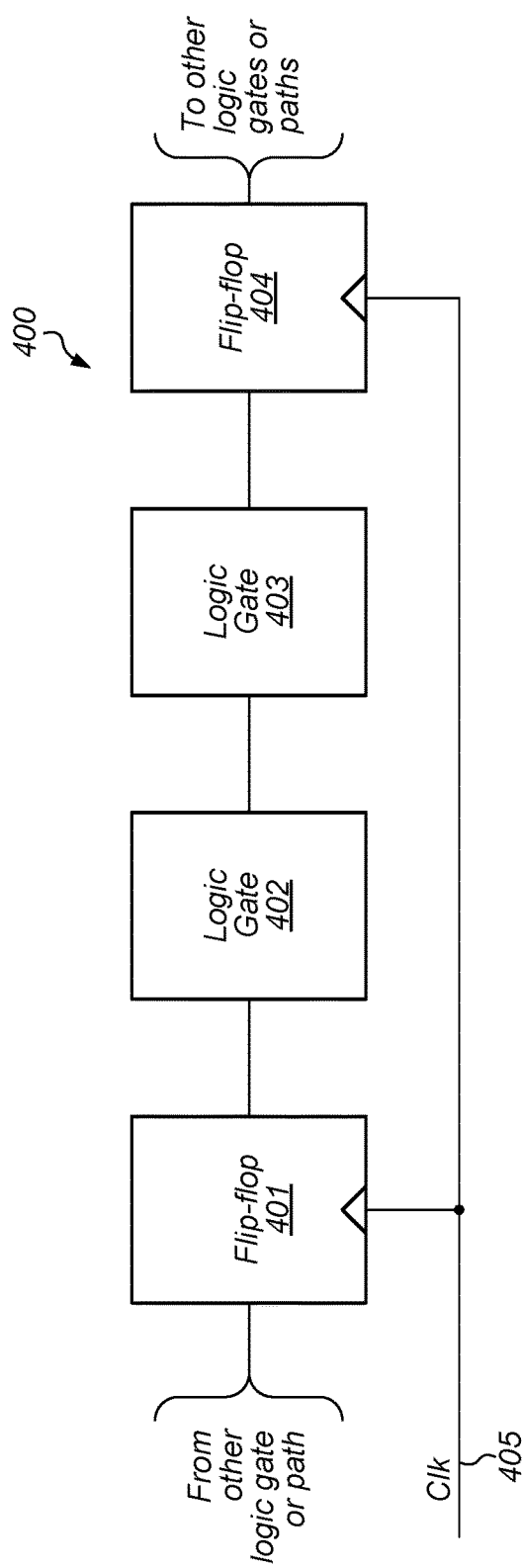
FIG. 4 illustrates an embodiment of a circuit path.

An example of a portion of a circuit path is illustrated in FIG. 4. Circuit path 400 may, in various embodiments, correspond to circuit path 306 as depicted in the embodiment of FIG. 3. In the illustrated embodiment, flip-flop 401 is coupled to logic gate 402, which is in turn, coupled to logic gate 403. Logic gate 403 is coupled to another flip-flop 404. The illustrated embodiment also includes a clock input 405 denoted as "CLK." Generally speaking, flip-flops 401 and 404 may correspond to any suitable state element, such as a static or dynamic flip-flop. Flip-flops 401 and 404 may operate to capture and store input data in response to clock input 405.

Logic gates 402 and 403 may be configured to implement combinatorial logic functions of any suitable type (e.g., AND, OR, NAND, NOR, XOR, and XNOR, or any suitable Boolean expression). Either of logic gates 402 or 403 may be implemented using static or dynamic logic. For example, if implemented using dynamic logic, logic gates 402 and 403 may also be clocked by clock input 405, or they may be clocked by a clock signal (not shown) that is derived from clock input 405. It is noted that the number of logic gates and connectivity shown in FIG. 4 are merely an illustrative example, and that in other embodiments, other numbers and configurations of gates and state elements may be employed.

During operation, the output of flip-flop 401 propagates to logic gate 402, where it is processed in accordance with the logical function implemented in logic gate 402. Although only one input is shown to logic gate 402, in various embodiments, logic gate 402 may include multiple inputs from different circuit paths. The output of logic gate 402 may then propagate to logic gate 403 where it is further processed in accordance with the logic function implemented in logic gate 403. As previously described above in regards to logic gate 402, logic gate 403 may, in other embodiments, include multiple inputs. The output of logic gate 402 may then propagate to the input of flip-flop 404.

When clock input 405 is asserted, flip-flop 404 may then capture the data output by logic gate 403. To ensure capture of the desired data in flip-flop 404, the desired data must arrive sometime before the assertion of clock 405 and be maintained for some time after the assertion of clock 405. Such setup and hold times are simulated prior to manufacturing but, in some cases, unforeseen effects may cause timing of the desired data to be such that the desired data is not properly captured.

Post-manufacturing testing may be used to identify circuit paths, such as, circuit path 400, that have marginal or failing timing. In such cases, by adjusting the threshold voltages of transistors included in the logic gates of the circuit path, timing parameters of the circuit path may be adjusted to allow for proper capture of data by a flip-flop. As described above in regard to FIG. 2, the adjustment of threshold voltages may be realized through the modification of work functions of the transistors by applying an external energy, such as, e.g. a laser. Once transistors have been modified within a marginal or failing circuit path have been adjusted, additional testing may be performed to verify that the threshold adjustments have resulted in the desired effect.

Alternatively, or additionally, transistors within a particular circuit path may be modified in order to the particular circuit path so as to provide different levels of performance (either speed or power) after manufacturing. Such tuning may allow for a single integrated circuit to be used in multiple applications, such as, low power or high-speed, for example. Modification of transistors, as described above, may also allow for changes in functionality after manufacturing. For example, read-only configuration registers may be reprogrammed, or the gain of an amplifier may be modified.

The circuit path illustrated in FIG. 4 may correspond to any of numerous different types of digital logic circuits, and may generally include any series of gates bounded by state elements. For example, the circuit path may correspond to a portion of a datapath within a processing device, such as processor 301 as described above with respect to FIG. 3. The datapath may be a portion of an adder, shifter, multiplier, divider, buffer, register file, other any other type of circuit or functional unit that operates to store or operate on data during the course of instruction execution. The circuit path may also correspond to control paths within such a processor that generate signals that control the operation of datapath or other elements within the processor. It is noted, however, that other configurations of logic paths are possible and contemplated.

Figure 5:
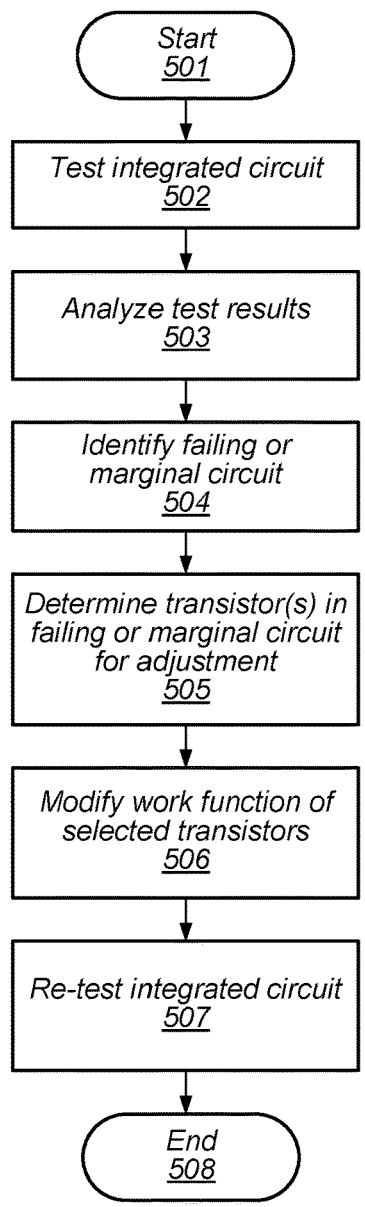
FIG. 5 depicts a flow diagram illustrating an embodiment of adjusting devices in a marginal circuit.

Turning to FIG. 5, a flow diagram depicting an embodiment of a method for adjusting transistors within a marginal circuit path is illustrated. Referring collectively to the embodiment of FIG. 4, and the flow diagram of FIG. 5, the method begins in block 501. An integrated circuit, such as, e.g., integrated circuit 100 as illustrated in FIG. 1, may then be tested (block 501). In various embodiments, the integrated circuit may be tested by an external tester to verify correction operation and desired performance levels. Individual functional units included in the integrated circuit may be tested in parallel, and results from the test save in the external tester or other suitable storage location.

The results from the test may then be analyzed (block 503). Such an analysis may include comparing save test results against previously determined results based on behavioral models of the integrated circuit. Results from different operating conditions, such as, e.g., different supply voltages and/or temperatures, may be analyzed. Once the test results have been analyzed one or more marginal or failing circuit paths, such as, e.g. circuit path 400, may be identified (block 505).

Using the test results, individual transistors included in the marginal or failing circuit path may be identified, and their respective work functions modified (block 506). In various embodiments, a laser or other external energy source, may be used to selectively modify the work function of one or more transistors included in the marginal or failing circuit path. The work function modification may adjust the threshold voltages of the transistors, resulting in a selective increase or decrease in speed for some logic gates included in the marginal or failing circuit path, thereby modifying the timing of the path.

The integrated circuit may then be re-tested to verify that the aforementioned modifications had the intended effect (block 507). If necessary, additional work function modifications may be made on the originally identified transistors, or additional transistors may be identified for work function modification based on results from the re-testing. Once all work function modifications have been made and verified, the method may conclude in block 508.

It is noted that the embodiment depicted in the flow diagram of FIG. 5 is merely an example. Other embodiments may include additional operations, or may omit one or more of the operations depicted in the flow diagram of FIG. 5.

Figure 6:
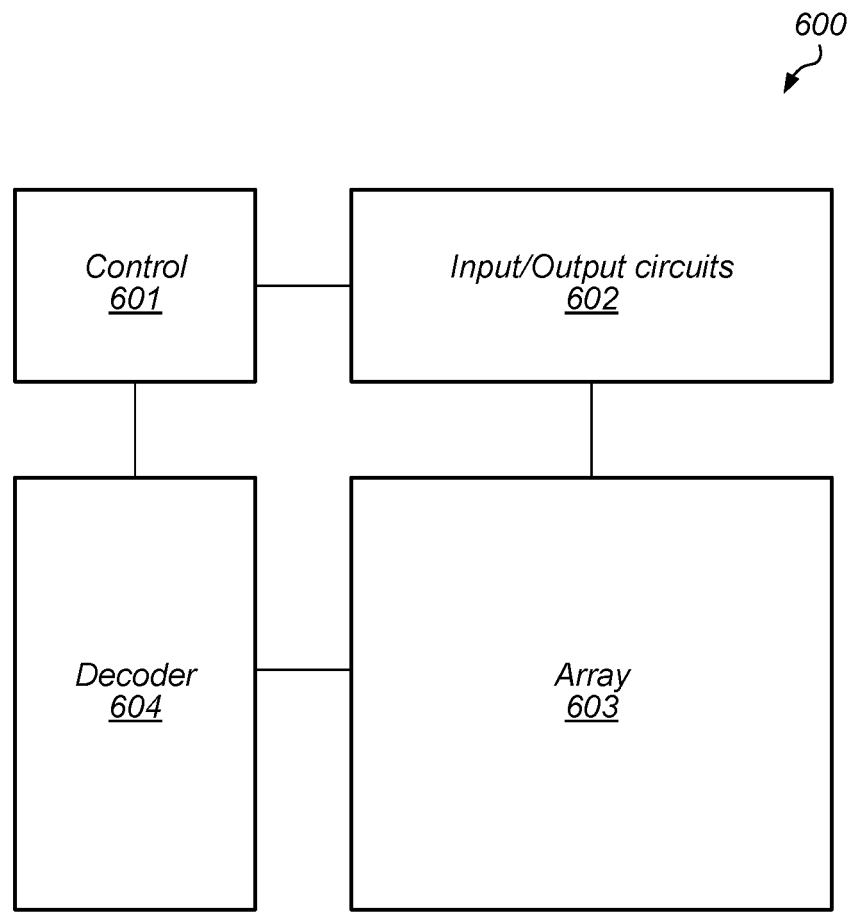
FIG. 6 illustrates an embodiment of a memory.

Turning to FIG. 6, an embodiment of a memory is illustrated. The illustrated embodiment may, in various embodiments, correspond to memory 302 of the embodiment depicted in FIG. 3. In the illustrated embodiment, memory 600 includes control circuit 601, input/output circuits 602, decoder 601, and array 603.

Array 603 may include multiple data storage cells arranged in a matrix of rows and columns. Each data storage cell may be configured to store one or more data bits, and may be designed in accordance with one of various design styles. For example, the data storage cells may include SRAM, DRAM, or ROM memory cells. In some embodiments, data may be programmed in ROM memory cells using external stimulus, such as, a laser, for example.

Control circuit 601 may include logic circuits and/or sequential logic circuits configured to generate timing and control signals to operate circuits included in input/output circuits 602 and decoder 603. Such timing and control signals may include signals to activate sense amplifiers, data input latches, data output latches, and the like.

Decoder 603 may assert a given one of multiple row and column selection signals dependent upon an address input to memory 600. In various embodiments, a given row selection signal (also referred to herein as "word lines") may be asserted dependent upon a portion of the address, while a given column selection signal may be asserted dependent upon a different portion of the address. In some cases, a voltage level of the asserted word line signal may correspond to a logical-1 level. Alternatively, the voltage level of the asserted word line may have multiple possible values for use in conjunction with multiple threshold memory cells, such as those described below in regard to FIG. 9.

It is noted that the embodiment illustrated in FIG. 6 is merely an example. In other embodiments, different memory architectures are possible and contemplated.

Figure 7:
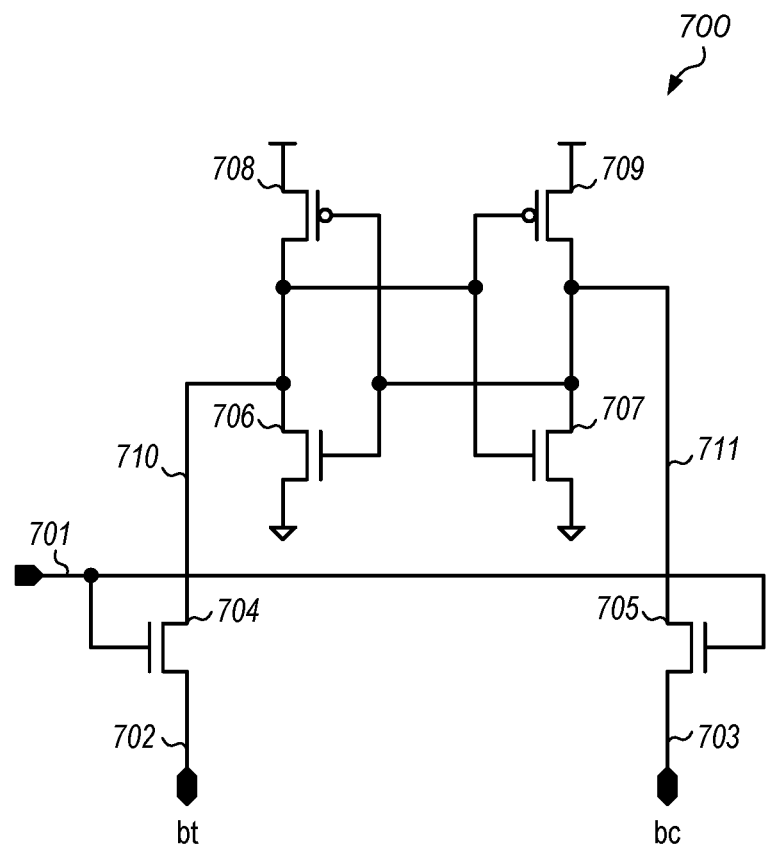
FIG. 7 illustrates an embodiment of a data storage cell.

FIG. 7 illustrates a data storage cell (also referred to herein as a "memory cell") according to one of several possible embodiments. In the illustrated embodiment, data storage cell 700 includes a true I/O 702 denoted as "bt," a complement I/O 703 denoted as "bc," and a selection input 701 denoted as "wl." Data storage cell 700 may, in some embodiments, correspond to a type of data storage cell included in array 603 as illustrated in FIG. 6.

In the illustrated embodiment, bt 702 is coupled to selection transistor 304 and bc 701 is coupled to selection transistor 705. Selection transistor 704 and selection transistor 705 are controlled by wl 701. Selection transistor 704 is further coupled to pull-up transistor 708 and pull-down transistor 706 through node 710, and selection transistor 705 is further coupled to pull-up transistor 709 and pull-down transistor 707 through node 711. Pull-up transistor 708 and pull-down transistor 706 are controlled by node 711, and pull-up transistor 709 and pull-down transistor 707 are controlled by node 710.

It is noted that although selection transistors, pull-up transistors, pull-down transistors, and pre-charge transistors may be illustrated as individual transistors, in other embodiments, any of these transistors may be implemented using multiple transistors or other suitable circuits. In various embodiments, a "transistor" may correspond to an individual transistor or other transconductance element of any suitable type (e.g., FinFET 100 as illustrated in FIG. 1), or to a collection of transistors.

As used and described herein, a pull-up transistor is a transistor coupled between a power supply node and another circuit node. Moreover, a pull-down transistor is a transistor coupled between a ground supply node and another circuit node. In the embodiments illustrated herein, power supply and ground supply nodes for a particular circuit, such as, e.g., data storage cell 700, are coupled to respective power and ground terminals. Such terminals may then be coupled to power supplies or ground supplies external to the circuit.

It is noted that in this embodiment, low refers to a voltage at or near ground potential and high refers to a voltage sufficiently large to turn on n-channel FinFETs and turn off p-channel FinFETs. In other embodiments, other circuit configurations may be used and the voltages that constitute low (logical 0) and high (logical 1) may be different.

At the start of the storage operation true I/O 702 and complement I/O 703 may both be high and selection input 701 is low. During the storage, or write, operation, selection input 701 may be switched high which couples true I/O 702 to node 710 and complement I/O 703 to node 711. To store a logical 1 into data storage cell 700, complement I/O 703 may be switched to a low. Since selection transistor 705 is on, node 711 is also switched low. The low on node 711 activates pull-up transistor 708 which charges node 710 high. The high on node 710, in turn, activates pull-down transistor 707, which further reinforces the low on node 711 establishing regenerative feedback. Once this regenerative feedback between nodes 710 and 711 has been established, selection input 701 may be switched low turning off selection transistor 704 and selection transistor 705, isolating node 710 from true I/O 702 and node 711 from complement I/O 703. The method of storing a logical 0 may be similar. Selection input 701 may be switched high and true I/O 702 may be switched low. Selection transistor 704 couples the low on true I/O 702 to node 710, which activates pull-up transistor 709. The high on node 711 activates pull-down transistor 706, reinforcing the low on node 710 and establishing the regenerative feedback. Data storage cells that store data via regenerative feedback are commonly referred to as static cells.

In the illustrated embodiment, data storage cell 700 outputs its stored data as the difference in voltage between true I/O 702 and complement I/O 703. (Data stored as the difference between two voltages may also be referred to herein as "differentially encoded".) At the start of the output process, true I/O 702 and complement I/O 703 may both be high and selection input 701 may be low. Asserting selection input 701 activates selection transistor 704 and selection transistor 705. If node 711 is low and node 710 is high, then a current will flow through selection transistor 705 and pull-down transistor 707 causing a reduction in voltage on complement I/O 703. If node 710 is low and node 711 is high, then a current will flow through selection transistor 704 and pull-down transistor 706 causing a reduction in voltage on true I/O 702. For either data state, the current that the data storage cell sinks from either the true I/O 702 or complement I/O 703 is referred to as the read current of the cell.

Ideally, the electrical characteristics of pull-down transistor 706 and pull-down transistor 707 would be identical, as would be the electrical characteristics of selection transistor 704 and selection transistor 705. Furthermore, in an ideal circuit, it might be desirable that pull-down transistor 706 and pull-down transistor 707 in one data storage cell in a memory device have identical electrical characteristics to pull-down transistor 706 and pull-down transistor 707 in another data storage cell in the memory device. During the semiconductor manufacturing process, however, differences in lithography, fluctuations in dopant levels, etc., may result in these transistors having different electrical characteristics (e.g., saturation current). Variation, due to manufacturing, in pull-down transistor 706, pull-down transistor 707, selection transistor 704 and selection transistor 705 from one data storage cell to another may result in variation in read currents, and, therefore variation in output voltages for the same stored data.

In some cases, the variation in the electrical characteristic of the transistors may result in smaller than average output voltages when the storage cell is read. Data storage cells that generate smaller than average output voltages may be referred to as weak cells and may be susceptible to small variations a voltage level of a power supply. If the value of the output voltage generated by a weak storage cell is sufficiently small, it may not be possible to properly determine the data stored in the data storage cell, because the output voltage may not be able to overcome imbalances and signal noise within a sense amplifier.

Such weak cells may be identified during post-manufacturing testing. Test results may indicate which of the transistors included in a data storage cell identified as weak are not performing as desired. In such cases, an external stimulus, such as describing in regards to FIG. 2, may be employed to adjust the work function of one or more of the transistors included in the data storage cell to allow for the data storage cell to operate as desired.

It is noted that the number of transistors and the connectivity shown in FIG. 7 are merely an illustrative example, and that in other embodiments, other numbers, types of transistors, and/or circuit configurations may be employed. It is also noted that in other data storage cell embodiments, other storage mechanisms may be employed. For example, a capacitor (as, e.g., in a dynamic random access memory (DRAM)), transistor implants (as, e.g., in a depletion programmable read-only memory (ROM)), or a floating gate structure (as in a single-bit or multi-bit non-volatile or flash memory) may be used to store data in a data storage cell.

Figure 8:
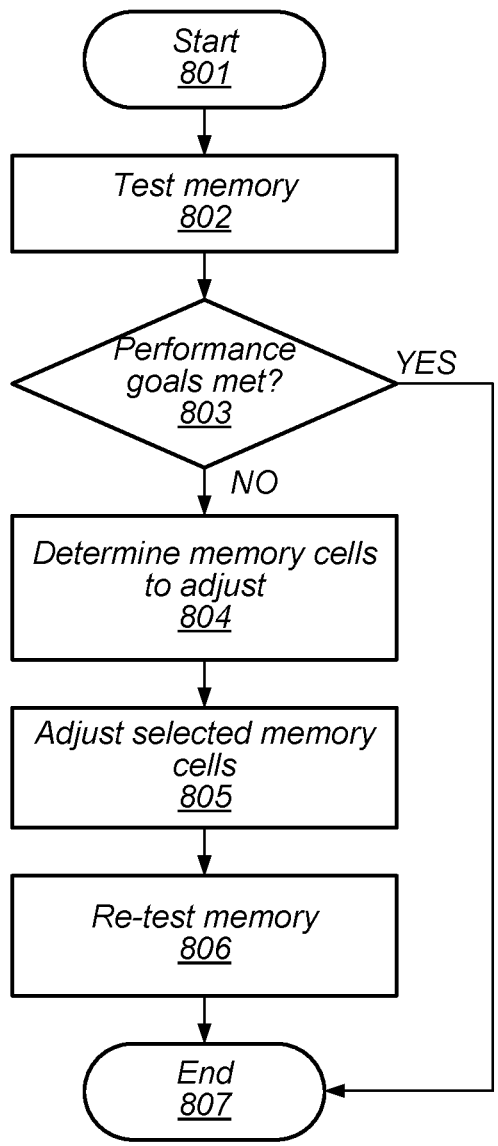
FIG. 8 depicts a flow diagram illustrating an embodiment of a method adjusting devices in a marginal data storage cell.

A flow diagram depicting an embodiment of a method for adjusting a memory cell is illustrated in FIG. 8. Referring collectively to the embodiment illustrated in FIG. 6, and the flow diagram of FIG. 8, the method begins in block 801. Memory 600 may then be tested (block 802). In some embodiments, memory 600 may be tested using an external tester through a direct memory access, or other suitable port included in an integrated circuit that includes memory 600. Alternatively, or additionally, an on-chip processor, or other logic circuit, may be configured to perform multiple tests on memory 600 and make results from the test available for outside test and/or analysis equipment.

The method may then depend on if memory 600 meets desired performance goals (block 803). If results of the test indicate that the performance goals have been met, then method may conclude in block 807. If, however, the results of the test indicate that memory 600 fails to meet the desired performance goals, then a determination may be made as to which memory cells are to be adjusted (block 804). By analyzing the results of the test, marginal or failing memory cells included in memory 600 may be identified. Additionally, in some embodiments, further tests may be performed to such marginal or failing memory cells to determine sensitivity to power supply voltage level, temperature, and the like. Such information may provide additional insight to determine which transistor(s) within a marginal or failing memory cell are causing the undesired performance.

The selected memory cells may then be adjusted (block 805). In various embodiments, a laser or other suitable stimulus source may be used to modify a work function of one or more transistors included in the selected memory cells. Such modification may result in multiple atoms moving into or out of the fin region of a FinFET as described above, in regard to FIG. 2.

Once the modifications have been made, memory 600 may then be re-tested (block 806). Depending upon the results of the re-test, additional modifications to memory cell transistors may be performed. Once all modifications and re-testing have been completed, the method may conclude in block 807.

It is noted that the method depicted in FIG. 8 is merely an example. In other embodiments, different operations and different orders of operations are possible and contemplated.

Figure 9:
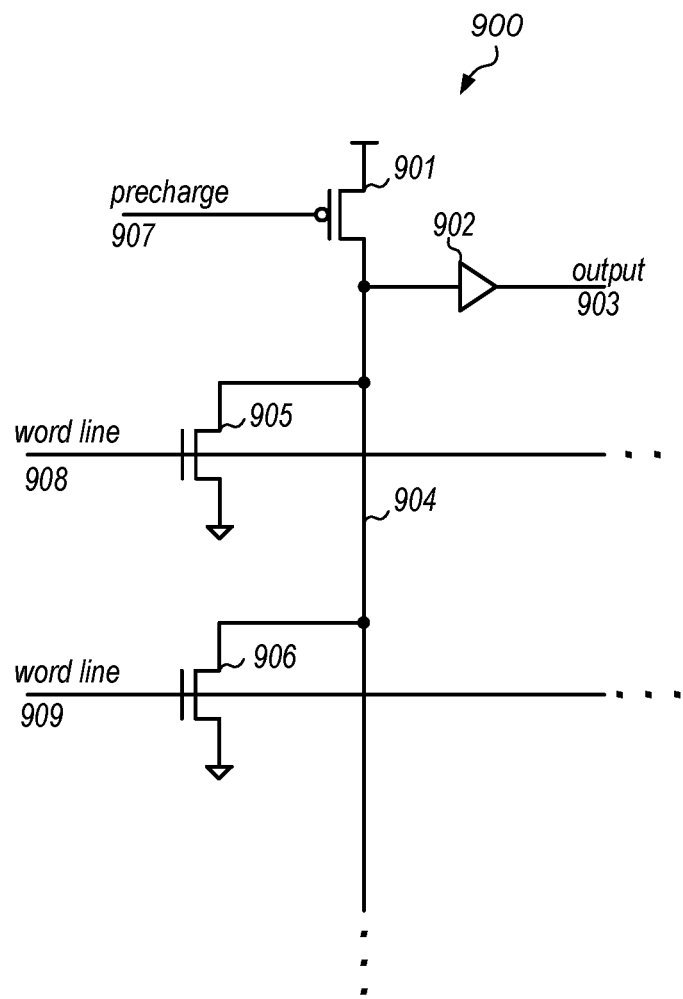
FIG. 9 illustrates an embodiment of a memory array.

Turning to FIG. 9, an embodiment of a memory array, such as, e.g., array 603 of memory 600, is illustrated. In the illustrated embodiment, array 900 includes pull-up transistor 901, amplifier 902, and transistors 905 and 906. Pull-up transistor 901 is coupled to bit line 904 and controller by precharge 907. Each of transistor 905 and 906 are coupled to bit line 904 and are controlled by word lines 908 and 909, respectively. The input of amplifier 902 is coupled to bit line 904, and the output of amplifier 902 is coupled to output 903.

Once manufactured, the threshold voltages of transistor 905 and 906 may be modified through work function adjustment by external stimulus. As described below in regard to FIG. 10, such stimulus may be dependent upon data received for storage, thereby allowing for the individual transistors to be used as memory cells. For example, the threshold voltage of transistor 905 may be decreased from a value generated during manufacture, while the threshold voltage of transistor 906 may be left at the value generated during manufacture.

During operation, precharge 907 is initially set a logical-0 value, thereby activating pull-up transistor 901, causing bit line 904 to be charged to a voltage level of the power supply coupled to pull-up transistor 901. Once the voltage level of bit line 904 has reached the desired level, precharge 907 may be set to a logical-1 value, disabling pull-up transistor 901.

Dependent upon an input address, and decode of the input address by a decoder, such as, e.g., decoder 604 of FIG. 6, one or word lines 908 and 909 will be asserted. Depending on threshold voltage of the transistor(s) coupled to the asserted word line, and the voltage level of the asserted word line, the transistor(s) coupled to the asserted word line may conduct, discharging bit line 904. For example, if word line 908 is asserted and the asserted voltage level is greater than the threshold voltage of transistor 905, bit line 904 may be discharged through transistor 905. Amplifier 903 may then amplify the resulting voltage level on bit line 904. It is noted that amplifier 903 may either be inverting or non-inverting. Alternatively, if the asserted voltage level of word line 908 is less than the threshold voltage of transistor 905, then transistor 905 remains in an off state, and bit line 904 does not discharge. By using amplifier 903 to detect whether or not bit line 904 has discharged, two different logic states may be determined.

If multiple different asserted voltage levels are allowed on word lines 908 and 909, and if transistors 905 and 906 may be programmed with a particular one of multiple threshold voltages by external modification of the transistors' work functions, more than one data bit may be stored in a particular transistor. For example, if four threshold voltages and corresponding word line voltages are used, two data bits may be stored in a given transistor. The four possible combinations of data bits, 00, 01, 10, and 11, may each correspond to a particular one of the four possible threshold voltage that may be set in a particular transistor.

It is noted that the embodiment illustrated in FIG. 9 is merely an example. In other embodiments, different numbers and arrangements of circuit components may be employed.

Figure 10:
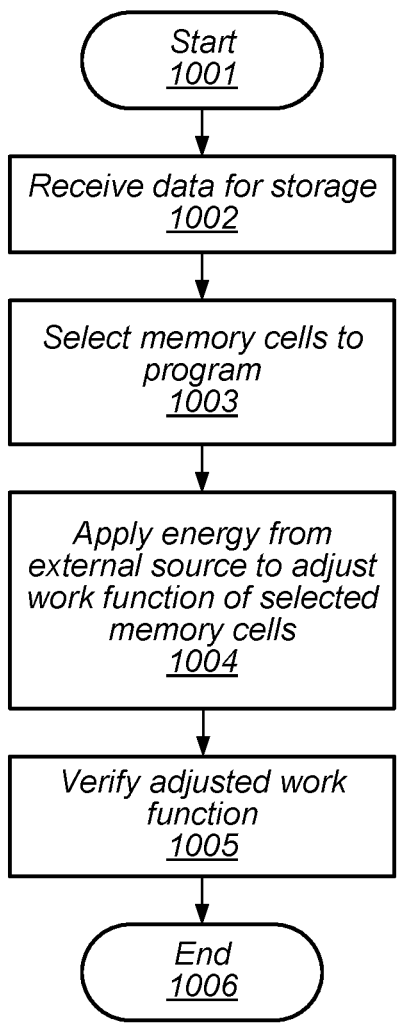
FIG. 10 depicts a flow diagram illustrating an embodiment of a method for programming data storage cells in a memory.

A flow diagram depicting a method for programming a ROM is illustrated in FIG. 10. Referring collecting to the embodiment illustrated in FIG. 9, and the flow diagram of FIG. 10, the method begins in block 1001. Data may then be received for storage in ROM (block 1002). In various embodiments, the data may correspond to program instructions to be executed by a processor or processor core, such as, processor 701 as illustrated in FIG. 7, for example.

Dependent upon the received data, one or more transistors, such as, transistors 905 and 906, corresponding to memory cells in the ROM may be selected for programming (block 1003). For example, in some embodiments, if the received data indicates that a logical-1 value should be stored in a particular memory cell, the threshold voltage of a corresponding transistor may be adjusted, while threshold values of transistors included in other memory cells may left at value generated during manufacturing.

Once the memory cells for threshold voltage adjustment have been identified, energy is applied from an external source to modify the work function and, therefore, the threshold voltage, of the selected memory cells (block 1004). In some embodiments, a laser of a particular frequency may be employed to apply the energy. A test involving reading each address location within the ROM may be then be performed to verify that the work function was adjusted correctly and the desired data was programmed into the ROM (block 1005). It is noted that since the programming is performed by adjusting a work function of a transistors within the ROM, an incorrectly programmed device may be re-programmed by the application of additional or different energy (e.g., energy of a different frequency) from the external source. Once the programmed data has been verified, the method may conclude in block 1006.

It is noted that the method depicted in FIG. 10 is merely an example. In other embodiments, different operations and different orders of operations may be employed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system, comprising:
    an integrated circuit including at least one memory circuit that includes a plurality of memory cells; and
    an external energy source, wherein the external energy source modifies a work function of at least one transistor included in a given memory cell of the plurality of memory cells using at least a portion of received data to program data to the given memory cell.

2. The system of claim 1, wherein to modify the work function of the at least one transistor included in the given memory cell, the external energy source increases a threshold voltage of the at least one transistor.

3. The system of claim 1, wherein to modify the work function of the at least one transistor included in the given memory cell, external energy source causes a decrease in a threshold voltage of the at least one transistor.

4. The system of claim 1, wherein a threshold voltage of the at least one transistor is set to a particular threshold voltage of a plurality of threshold voltages.

5. The system of claim 4, wherein each threshold voltage of the plurality of threshold voltages corresponds to a particular combination of a plurality of data bits included in the data.

6. The system of claim 1, wherein the external energy source includes a laser.

7. The system of claim 1, further comprising a tester unit configured to test the memory circuit in response to a determination that the work function of the at least one transistor has been modified.

8. A method, comprising:
    testing, by a tester unit, an integrated circuit including at least one memory circuit that includes a plurality of memory cells;
    receiving, by the tester unit, data to be programmed in the at least one memory circuit; and
    modifying, using an energy source external to the integrated circuit, a work function of at least one transistor included in a given memory cell of the plurality of memory cells using at least a portion of the data.

9. The method of claim 8, wherein modifying the work function of the at least one transistor included in the given memory cell includes increasing a threshold voltage of the at least one transistor.

10. The method of claim 8, wherein modifying the work function of the at least one transistor included in the given memory cell includes decreasing a threshold voltage of the at least one transistor.

11. The method of claim 8, wherein modifying the work function of the at least one transistor includes setting a threshold voltage of the at least one transistor to a particular threshold voltage of a plurality of threshold voltages.

12. The method of claim 11, wherein each threshold voltage of the plurality of threshold voltages corresponds to a particular combination of a plurality of data bits included in the data.

13. The method of claim 8, further comprising testing the memory circuit in response to determining that the work function of the at least one transistor has been modified.

14. The method of claim 13, further comprising re-modifying the work function of the at least one transistor based on results of testing the memory circuit.

15. A system, comprising:
    an integrated circuit including at least one memory circuit that includes a plurality of memory cells; and
    a tester unit configured to:
        test the memory circuit;
        determine at least one memory cell of the plurality of memory cells to adjust based on a comparison of test results to performance goals;
        adjust the at least one memory cell using an energy source external to the integrated circuit; and
        re-test the memory circuit.

16. The system of claim 15, wherein to adjust the at least one memory cell, the tester unit is further configured to modify a work function of at least one transistor included in the at least one memory cell using the energy source external to the integrated circuit.

17. The system of claim 16, wherein to modify the work function of the at least one transistor, the tester unit is further configured to increase a threshold voltage of the at least one transistor.

18. The system of claim 16, wherein to modify the work function of the at least one transistor, the tester unit is further configured to decrease a threshold voltage of the at least one transistor.

19. The system of claim 15, wherein to test the memory circuit, the tester unit is further configured to determine a sensitivity of the memory circuit to changes in a voltage level of a power supply signal coupled to the memory circuit.

20. The system of claim 15, wherein the performance goals include a power consumption goal.

* * * * *